United States Patent [19]
Lev et al.

[11] Patent Number: 5,300,829
[45] Date of Patent: Apr. 5, 1994

[54] BICMOS CIRCUIT WITH NEGATIVE $V_{BE}$ PROTECTION

[75] Inventors: Lavi A. Lev, San Jose, Calif.; Ian A. Young, Portland, Oreg.

[73] Assignee: Intel Corporation, Santa Clara, Calif.

[21] Appl. No.: 943,406

[22] Filed: Sep. 9, 1992

[51] Int. Cl.$^5$ ............................................. H03K 19/02
[52] U.S. Cl. .................................... 307/446; 307/473; 307/570
[58] Field of Search ............... 307/446, 443, 570, 473; 365/203

[56] References Cited

U.S. PATENT DOCUMENTS

| | | | |
|---|---|---|---|
| 4,649,294 | 3/1987 | McLaughlin | 307/446 |
| 4,703,203 | 10/1987 | Gallup et al. | 307/570 |
| 4,730,132 | 3/1988 | Watanabe et al. | 307/446 |
| 5,068,548 | 11/1991 | El Gamel | 307/446 |
| 5,107,142 | 4/1992 | Bhamidipaty | 307/570 |

FOREIGN PATENT DOCUMENTS

| | | |
|---|---|---|
| 0383554A2 | 2/1990 | European Pat. Off. . |
| 0490243A1 | 6/1992 | European Pat. Off. . |
| 2249444 | 5/1992 | United Kingdom . |

Primary Examiner—Edward P. Westin
Assistant Examiner—Jon Santamauro
Attorney, Agent, or Firm—Blakely, Sokoloff, Taylor & Zafman

[57] ABSTRACT

A BiCMOS circuit, with protection against a negative base-emitter voltage, is described. The bipolar device is typically coupled between, for example, $V_{DD}$ and an output. An input is coupled to the base of the bipolar device, turning it on or off. CMOS circuitry is included which isolates the base of the bipolar device from the input when the input goes low and discharges the base through the output. Additional circuitry is disclosed which causes the output to float whenever an enable line is low and causes the output to be at either the same or inverted logic state as the input whenever the enable line is high, to form a non-inverting or inverting tri-state buffer, respectively.

13 Claims, 8 Drawing Sheets

BICMOS CIRCUIT WITH NEGATIVE $V_{BE}$ PROTECTION

FIELD OF THE INVENTION

The present invention relates to the field of integrated circuits which combine bipolar and complementary metal-oxide semiconductor (CMOS) devices on the same substrate.

BACKGROUND OF THE INVENTION

In recent years, much effort has been directed toward developing digital logic circuits which combine bipolar and CMOS technologies in a single integrated circuit. The combination of bipolar and CMOS technologies is particularly advantageous since the superior aspects of each may be exploited to yield optimal circuit performance.

For example, CMOS circuits have the advantages of extremely low quiescent power consumption, rail to rail output capability, high density, and a very high input impedance. Bipolar logic circuits, on the other hand, are useful in driving large capacitive loads, have fast switching capabilities, and feature better performance over temperature and power supply. These attributes have led to the development of a family of BiCMOS inverting logic circuits which employ bipolar transistors to drive output loads, while utilizing CMOS devices to perform the basic logic functions.

One problem with bipolar devices is that they suffer from a reliability problem when the voltage across the base and emitter junction ($V_{BE}$) is negative. This reliability problem typically results in creation of base-emitter leakage current that is a function of negative base-emitter stress voltage and stress time. This leakage current degrades the circuit performance of the bipolar transistors. For example, consider the "bare-base" buffer circuit 10 of FIG. 1. If input node 11 is initially at high voltage level (e.g. +5 V), bipolar transistor 12 will be on, since the base is driven by the input signal and bipolar transistor 12 is connected as an emitter follower. Also, when input node 11 is at a high voltage level, a low voltage level will result at the gate of MOS transistor 15 due to inverter 16. Transistor 15 will thus be turned off, electrically isolating output node 14 from ground $V_{SS}$. Output node 14 will then be at a high voltage level due to the emitter follower operation of bipolar transistor 12 with its collector coupled to the $V_{DD}$ mode. Conversely, when input node 11 switches to a low voltage level, transistor 12 is off, preventing any current flow from $V_{DD}$ mode 13 to output node 14. Transistor 15 is on, discharging the voltage at output node 14 to ground. However, input node 11 can go low faster than output node 14 due to the delay through inverter 16 and transistor 15. When this occurs, the base-emitter voltage $V_{BE}$ across bipolar transistor 12 will be negative (i.e. lower on the base side than the emitter side) causing the reliability voltage stress problem discussed above.

Similarly, a bipolar device cannot be used in a signal bus pre-charge circuit due to reliability problems caused by the negative $V_{BE}$ that can develop. For example, if the circuit 20 of FIG. 2 were used as a pre-charge circuit, transistor 22 would charge output node 24 so long as node 21 is at a high voltage state (logical one). This is due to the bipolar emitter follower between input node 21 and output node 24. Once the base is turned off (node 21 at a low voltage state, i.e. logical zero), a negative base-emitter voltage will result due to the remaining charge on output node 24.

What is needed is an integrated circuit combining CMOS and bipolar technologies which does not develop a negative $V_{BE}$ during operation. Such a circuit should be implemented with a minimum device count and should retain the advantages of both bipolar and CMOS technologies discussed above. Additionally, the circuitry used to protect the base should also be capable of tri-stating the bipolar device.

SUMMARY OF THE INVENTION

A BiCMOS circuit with protection against negative base-emitter junction voltage ($V_{BE}$) is disclosed. The circuit includes means for discharging the base of a bipolar device through the output, rather than a first input, whenever the first input goes low. Therefore, since the base of the bipolar device is discharged through the same output as the emitter, there can never be a negative base-emitter voltage. A second input is provided which is coupled to the gates of a pair of CMOS devices. The CMOS devices are configured such that whenever the second input is low, the first input is coupled to the base of the bipolar device allowing it to turn on or off as a function of the input signal, while the coupling between the base and the output is open. Whenever the second input is high, the base of the bipolar device is coupled to the output, and the coupling between the first input and the base is open.

When used in place of a bare-base bipolar device, as a two state buffer, or as a pre-charge device, the second input is the inverted signal of the first input. The invented circuit can also be used as part of an inverting or non-inverting tri-state buffer where the first input is coupled to a "data" line, and the second input is coupled to an "enable" line. When used as a tri-state buffer, additional circuitry is disclosed which causes the output to float whenever the enable line is low.

DETAILED DESCRIPTION OF THE PREFERRED EMBODIMENT

A BiCMOS circuit with protection against negative $V_{BE}$ In the following description, numerous specific details are set device types, voltages, etc., in order to provide a thorough present invention. However, it will be obvious to one skilled in the present invention may be practiced without these specific details. In well known elements have not been shown or described to avoid obscuring the present invention. Additionally, although the is illustrated as part of a bare-base buffer circuit, as part of circuit and as part of an inverting and non-inverting tri-state buffer, it appreciated by one skilled in the art that the circuit of the present in any type circuit requiring protection against negative $V_{BE}$ tri-state circuit device is desirable.

Figure 3A:
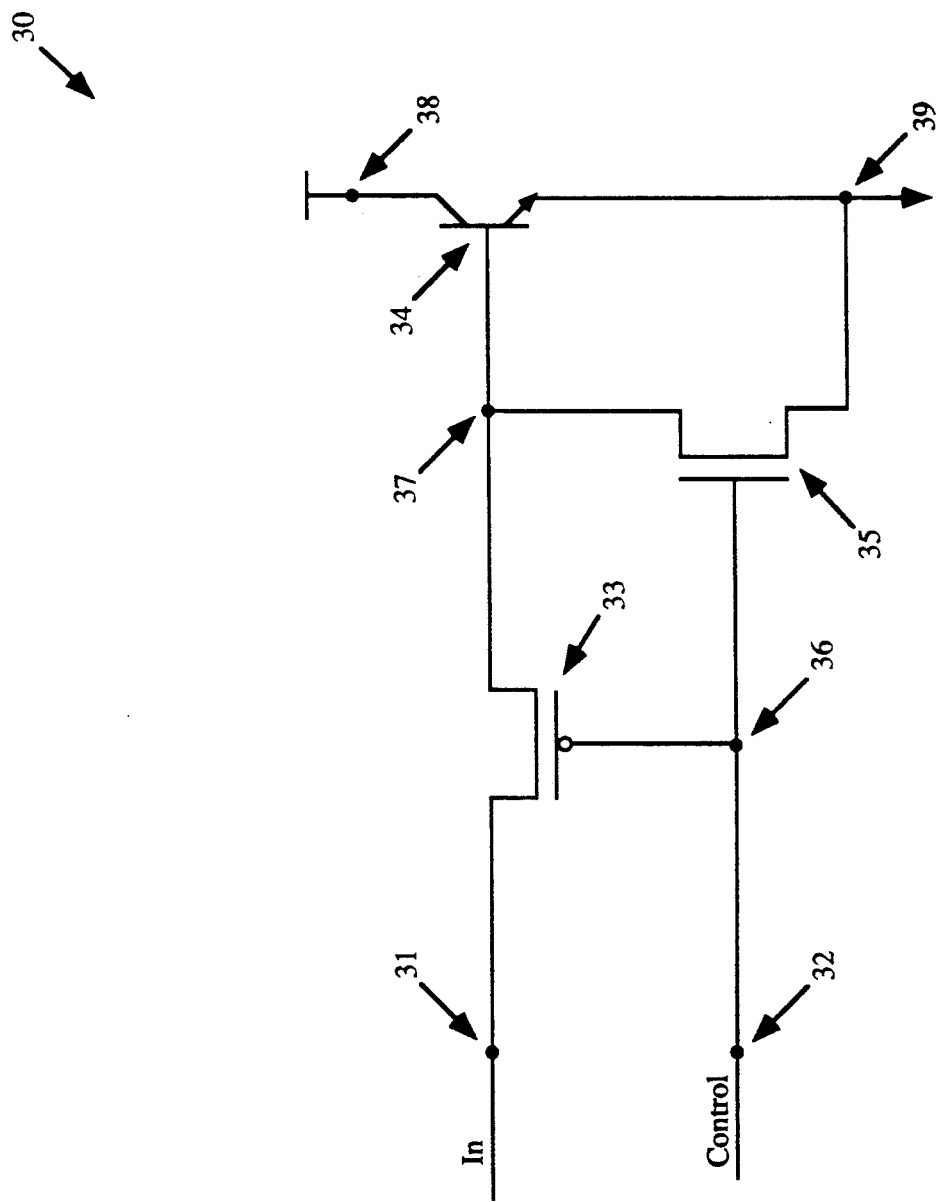
FIG. 3A shows the circuit of the present invention when used as protection against a negative $V_{BE}$ of a bipolar transistor.

Referring to FIG. 3A, circuit 30 shows the currently embodiment of the BiCMOS circuit with negative $V_{BE}$ currently preferred embodiment, transistor 33 is a PMOS 34 is an NPN bipolar transistor, and transistor 35 is an NMOS gates of transistor 33 and 35 are coupled to the control line drain of transistor 33 is coupled to the drain of transistor addition, the base of transistor 34 is coupled to the drain of at node 37. The emitter of transistor 34 is coupled to node 39. Node ground via one or more transistor devices or other circuits.

If input node 31 of FIG. 3A is at a high voltage state, 32 is at a low voltage state, transistor 33 will be on while is off. This in turn will cause the input high voltage to propagate to bipolar transistor 34 turning it on, creating an emitter follower 39. Node 39 is the output node of the circuit. In this case, input node 31 being high while control node 32 is low is a logical state at node 39.

If input node 31 is then turned to logical low voltage node 32 maintains the logical low state, node 37 is pulled to $V_{tp}$ voltage of the low voltage on node 31. Note that the $V_{tp}$ threshold voltage of transistor 33 which includes body effect since the source 33 is below the bulk N-WELL potential of $V_{CC}$. N-channel turned off at this time. Therefore, a negative $V_{BE}$ voltage can be maximum possible negative $V_{BE}$ is lower than the $V_{CC}$ the $V_{tp}$ drop.

Figure 3B:
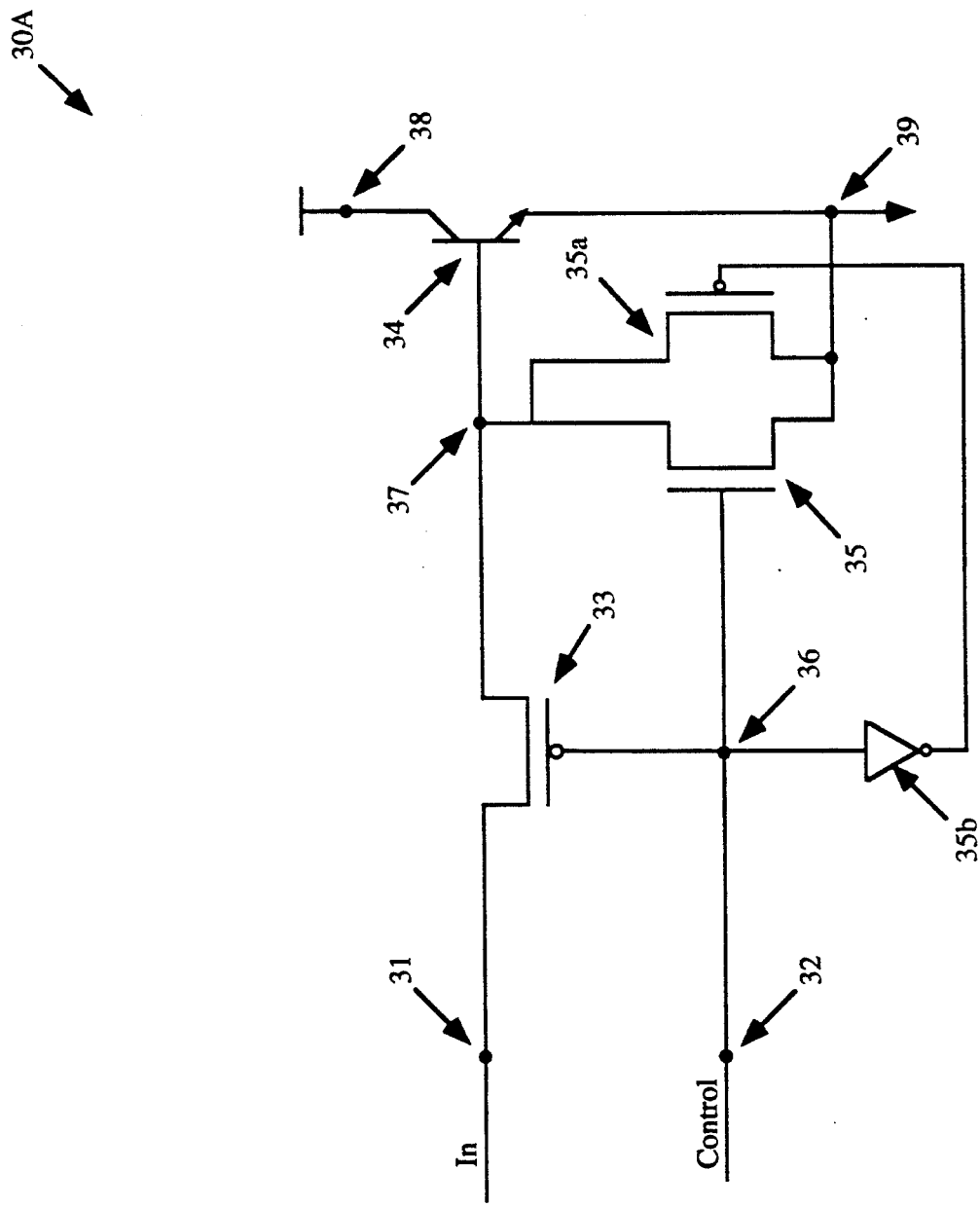
FIG. 3B shows the improvement of the circuit of FIG. 3A.

When control node 32 receives a logical high control is turned off and transistor 35 is turned on. At this time, if registers a logical high voltage, it is discharged through output node 39 transistor 35. Circuit 30 is then disabled receiving any input input node 31. In this situation, node 37 is assured not to be than the emitter of transistor 34 since it is now discharged FIG. 3B illustrates a circuit 30A which is an improvement FIG. 3A. In FIG. 3B, circuit 30A is identical to circuit 30 of a P-channel transistor 35a is coupled in parallel with transistor 35. The source of transistor 35a is coupled to node 37 and transistor 35a is coupled to node 39. The gate of P-channel receives the control signal at node 32 via an inverter 35b. Logically transistor 35a is turned on and off by the control signal in the same manner In an alternative embodiment, N-channel transistor 35 and transistor 35a can be made of appropriate width to resistance between nodes 39 and 37, when transistors 35 and meant to be "on."

The purpose of providing P-channel transistor 35a in N-channel transistor 35 is to provide a better discharge path and 39 when control node 32 receives a logical high control transistor 35 on.

Because transistor 35 is an N-channel transistor, it may be even if control node 32 receives the logical high control registers a voltage which is above the voltage level of the control signal minus a threshold voltage $V_{tn}$ of transistor 35, is turned off even if control node 32 registers the logical high control $V_{tn}$ voltage is the threshold voltage of an N-channel transistor. transistor 35a is coupled in parallel with transistor 35 as shown discharge path between nodes 37 and 39 is not broken when node a voltage which is higher than the voltage level of the signal minus the $V_{tn}$ voltage of transistor 35. When node 39 voltage which is above the voltage level of the logical high control node 32 minus the $V_{tn}$ voltage, transistor 35 is off but is on, which equalizes the voltage level between nodes 37 and 39. By transistor 35a in parallel with N-channel transistor 35, is formed and either of or both of transistor 35 and 35a will be depending on the voltage at node 39 when control node 32 register the signal.

Figure 5:
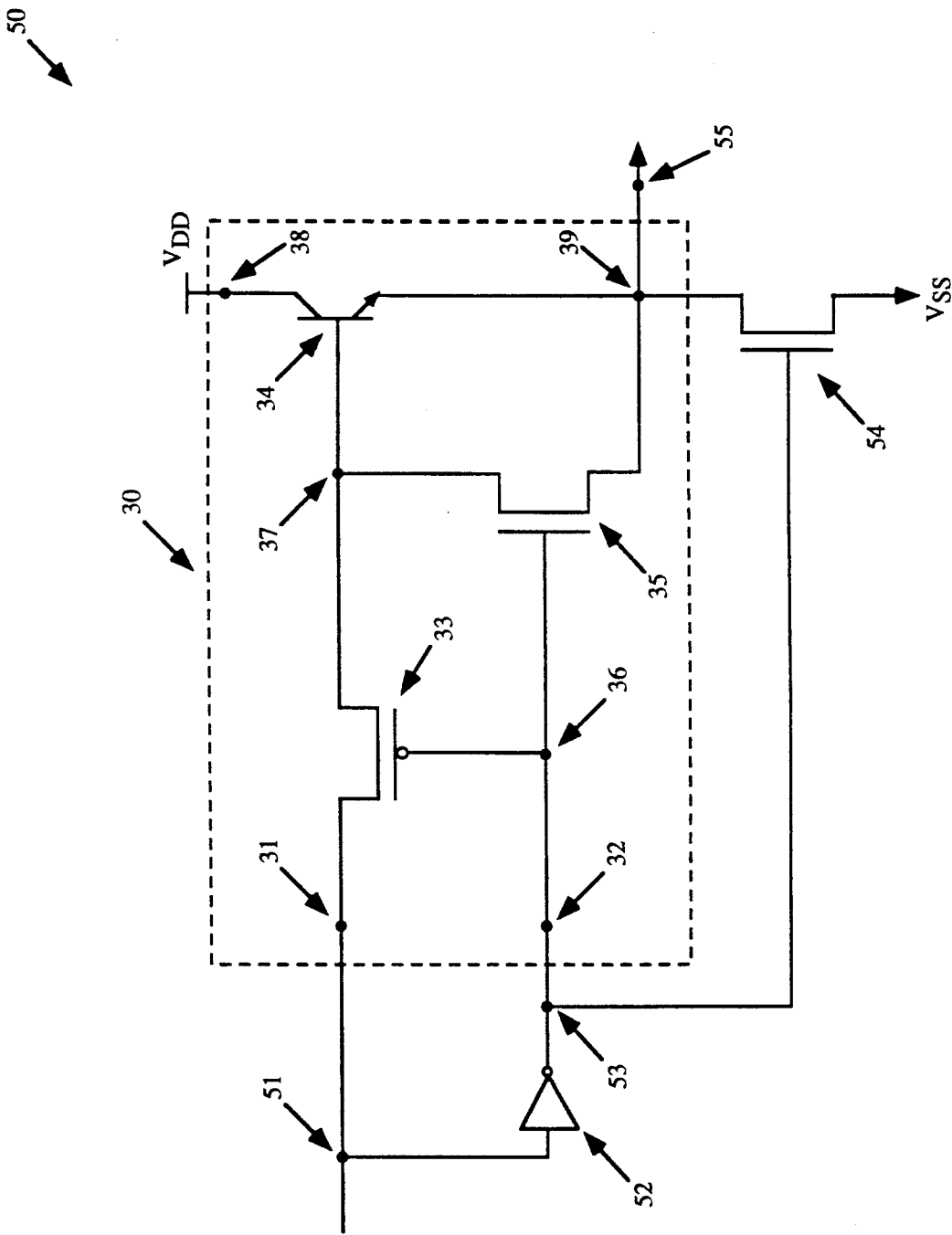
FIG. 5 shows the circuit of FIG. 3A when used in a bare-base circuit.
Figure 6:
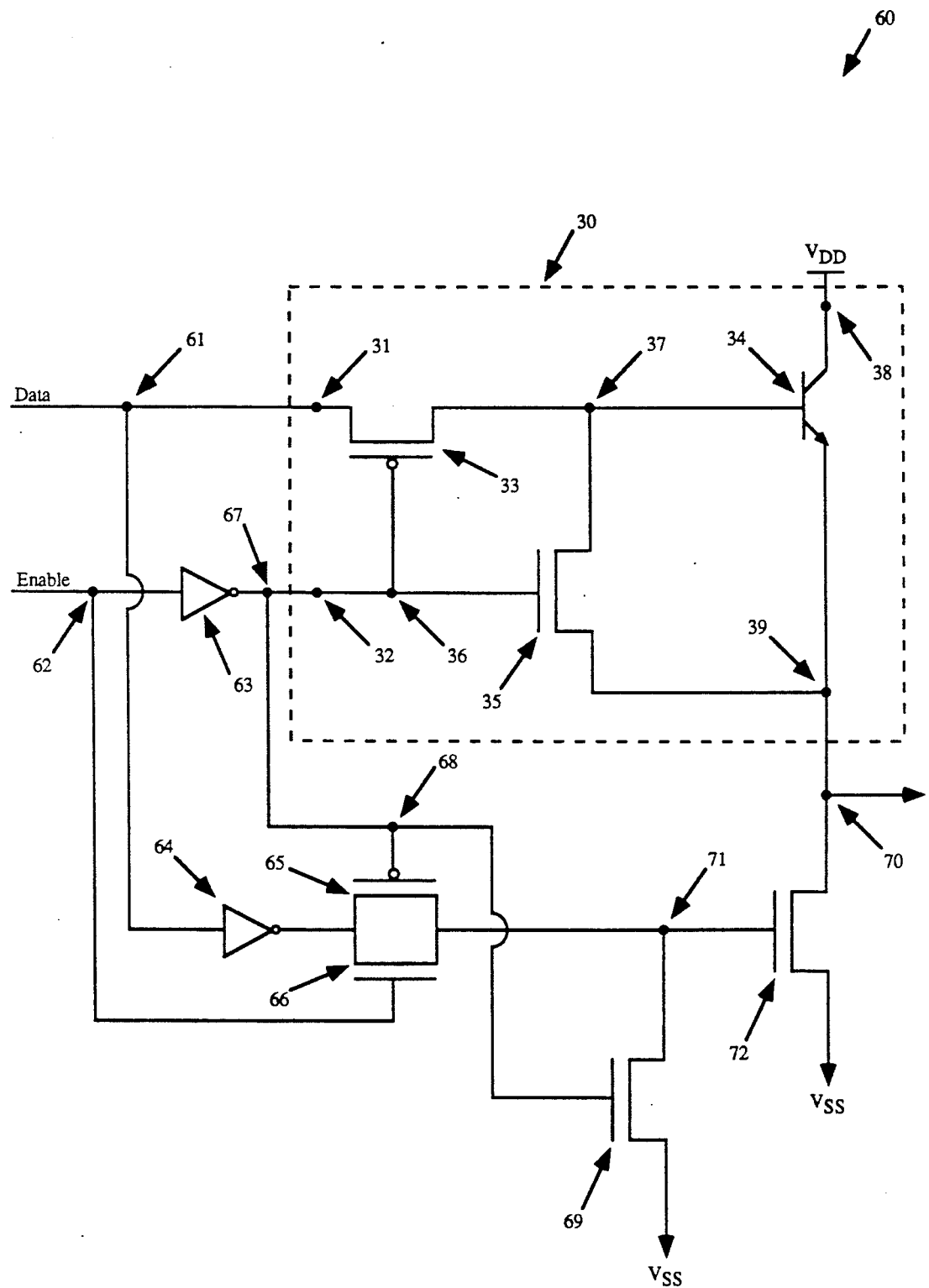
FIG. 6 shows the circuit of FIG. 3A when used as part of a non-inverting tri-state buffer.
Figure 7:
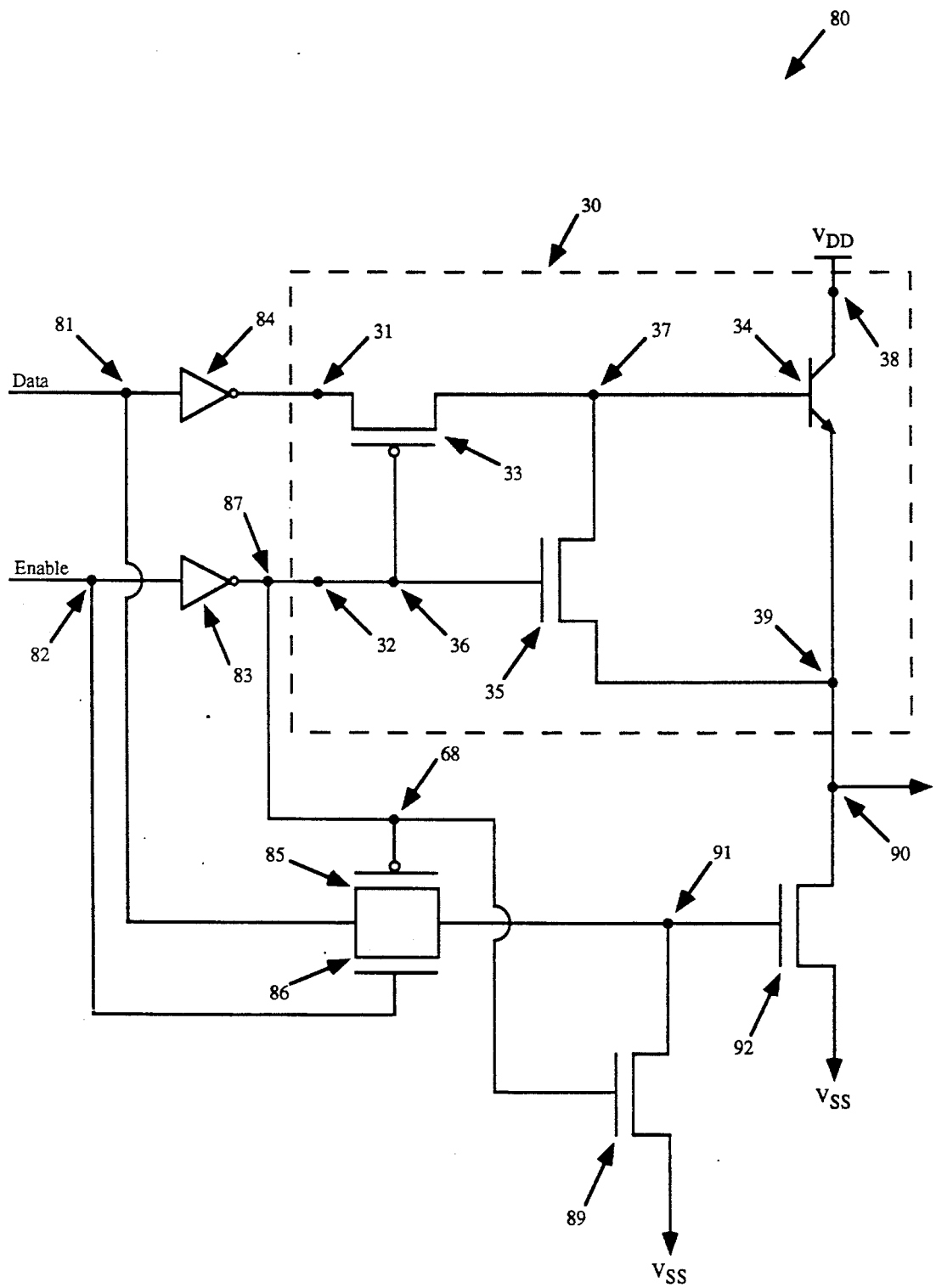
FIG. 7 shows the circuit of FIG. 3A when used as part of an inverting tri-state buffer.

In FIGS. 4–7, circuit 30 of FIG. 3A is shown as part of circuits, including as part of a pre-charge circuit (FIG. 4), as part of buffer circuit (FIG. 5), as part of a non-inverting tri-state BiCMOS (FIG. 7). It shall also be noted that circuit 30A of FIG. 3B can replace FIG. 3A to be used as part of the circuits shown in FIGS. 4–

Figure 4:
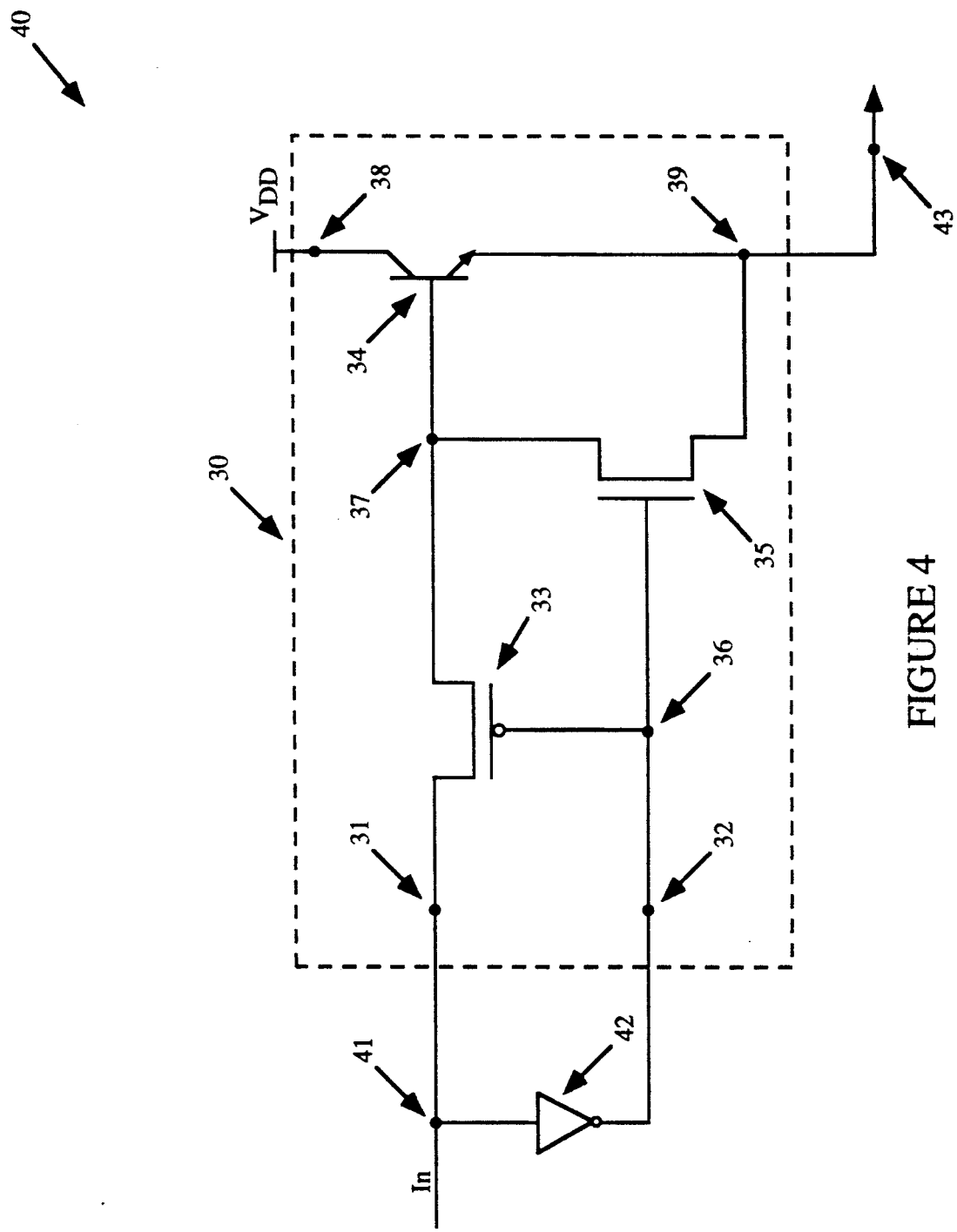
FIG. 4 shows the circuit of FIG. 3A when used in a pre-charge circuit.

Referring to FIG. 4, the currently preferred embodiment of circuit 40 is shown. Circuit 40 includes input node 41 and to input node 41. In the currently preferred embodiment, input coupled to node 31 of circuit 30, while the output of inverter is coupled to node 32 of circuit 30. Output node 43 of circuit 40 is coupled circuit 30 and to the next stage of circuits (not shown). The circuit 40 includes precharging an SRAM array, for example. circuit 40 can also be used to precharge register file bits. precharge is a mechanism where a node is charged to a high voltage state conditionally discharged to low or remain high. This saves the it takes to generate a high voltage from a low voltage state.

If input node 41 is taken to a logical high voltage state, inverter 42 will be low. In this case, transistor 33 will be transistor 34 on and forming an emitter follower between and output node 43. The low output of inverter 42 will also cause transistor isolating the base of transistor 34 from the output. The charge output node 43.

Figure 2:
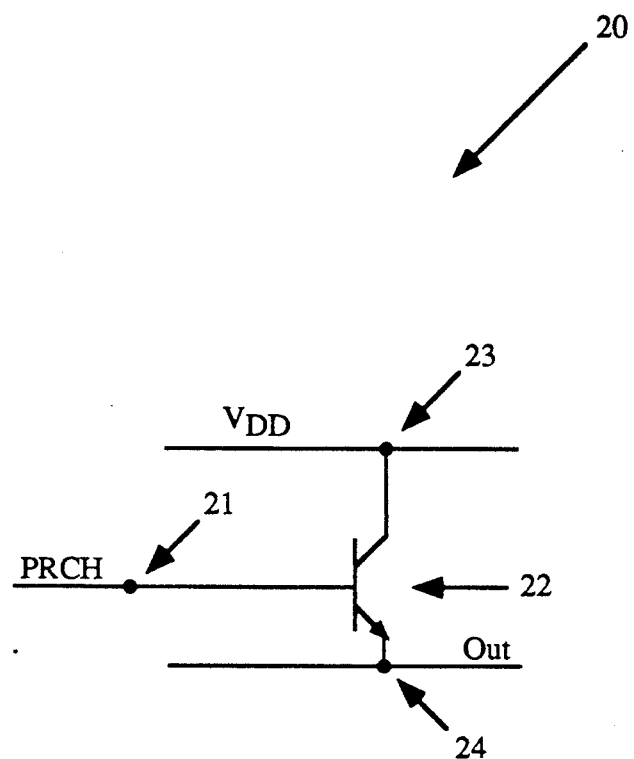
FIG. 2 is an example of a prior art pre-charge device.

When input node 41 is taken to a logical low voltage state, inverter 42 will be high, turning transistor 33 off and In this case, the base of transistor 34 will be shorted to the output 35 which is coupled to output node 43 at node 39. The circuit 40 events to happen in the next stage of the circuit to which coupled to discharge output node 43. Note that unlike 20 of FIG. 2, transistor 34 of FIG. 4 cannot develop a negative as input node 41 is switched from high to low due to the isolation of input node 41 provided by transistor 33 and the shorting of the base through transistor 35 when input node 41 switches from high to low.

FIG. 5 shows a bare-base circuit 50 which employs circuit 3A of the present invention. When input node 51 is taken high, inverter 52 will be low. Node 31, coupled to node 51, will be 32, coupled to the output of inverter 52, will be low. The circuit 30 portion of circuit 50 under these circumstances is described in connection with FIG. 3A when node 31 is high and node 32 is that nodes 31 and 32 cannot be both at the low voltage, the some level of negative $V_{BE}$ for FIG. 3A. Node 39 will be conditions. Output 55 of FIG. 5 (coupled to node 39) will then input node 51 is high. Note that under these conditions to inverter 52 at node 53, will be off due to the low from isolating node 39 (and, therefore, output 55) from ground $V_{SS}$. is an n-type MOS transistor in the currently preferred embodiment.

Figure 1:
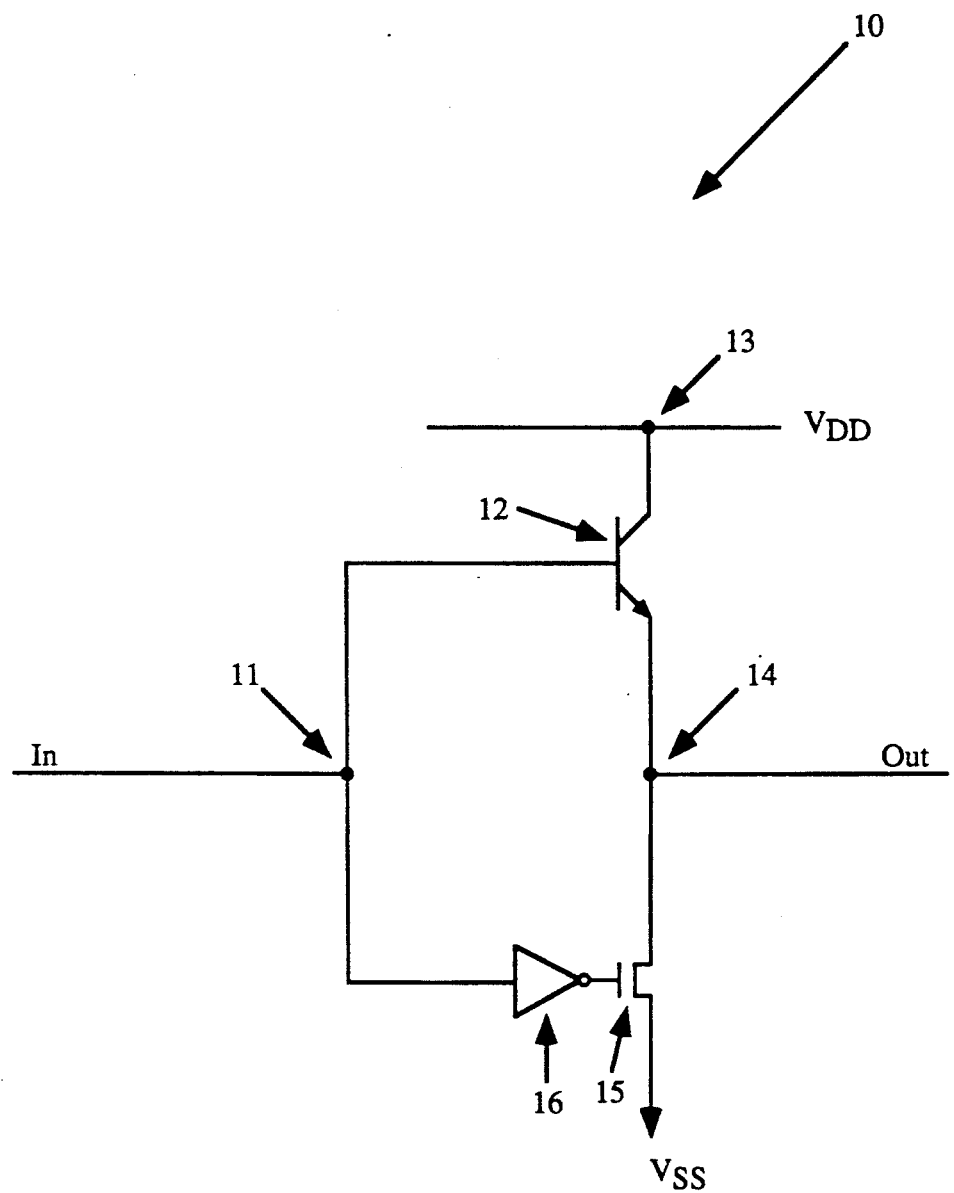
FIG. 1 is an example of a prior art "bare-base" circuit.

When node 51 is taken low, the output of inverter 52 will case, node 31 will be low and node 32 high and the operation portion of circuit 50 will be identical to that described for in conjunction with FIG. 3A. Transistors 33 and 34 will be off and 54 will be on. In this case, the output, as well as transistor 34, are discharged to ground $V_{SS}$ through transistor 54. transistor 34 can never be discharged faster than the output the bare-base circuit of FIG. 1) since it is discharged rather than through input node 51. Thus, a negative $V_{BE}$ cannot circuit 50 of FIG. 5 can be used as, for example, a two state FIG. 6 shows a tri-state noninverting buffer circuit 60 circuit 30 of FIG. 3A of the present invention. Data node 61 input node 31. Data node 61 is also coupled to inverter 64, which is coupled to transistors 65 and 66, which are connected in switch as shown in FIG. 6. Enable node 62 couples an Enable signal to transistor 66. Enable node 62 also couples the Enable signal the output of which is coupled to node 32. The output of inverter is also coupled to node 67, which is further coupled to the gate of transistor node 68, and to the gate of transistor 69. The output of transistors 65 coupled to the gate of transistor 72. In the currently preferred transistors 66, 69, and 72 are n-type MOS transistors, and transistor 65 transistor.

When enable node 62 is high (i.e., a high Enable signal), on. The output of inverter 63 is low. As a result of the low inverter 63, transistor 33 is on, transistor 35 is off, on, and transistor 69 is off.

Now consider the operation of circuit 60 of FIG. 6 while 62 is high. If data node 61 is high, the output of inverter 64 Since transistors 65 and 66 are on, transistor 72 is off, isolating 70 from ground $V_{SS}$. Also, since transistor 33 is on, transistor on allowing current to flow from node 38 to output node 70 (emitter 37), resulting in a high voltage state at output node 70.

With enable node 62 still high, if data node 61 is low, down to $V_{tp}$ from the ground $V_{SS}$. This causes gradually discharge the high voltage through the drain to substrate current transistor 33. Also, while data node 61 is low, the output of inverter 64 will be high thus turning transistor 72 on (since transistors 65 and 66 are on) and thereby quickly discharging output node 70 to ground $V_{SS}$ through transistor 72.

Thus, while enable node 62 is at a high state, output 70 will be at a high state when data node 61 is high, and at a low state when data node 61 is low (i.e. when enable=1, output node 70=data).

When enable node 62 is low, the output of inverter 63 will be high. Transistors 65 and 66 will be off while transistor 69 will be on. Since transistor 69 is connected to ground, node 71 will be low whenever enable node 62 is low thus turning off transistor 72 thereby isolating output node 70 from ground. Additionally, due to the high output of inverter 63, transistor 33 will be off, isolating transistor 34 from data node 61. Transistor 35 will be on, coupling the base of transistor 34 to output node 70 through transistor 35. Thus, when enable node 62 is low, output node 70 is floating.

Therefore, when enable node 62 is high, output node 70 equals data, and when enable node 62 is low, output node 70 is floating.

FIG. 7 shows tri-state inverting buffer circuit 80. Circuit 80 is similar to circuit 60 of FIG. 6 except that inverter 84 is placed between the data node 81 and input node 31 of circuit 30, and there is no inverter between data node 81 and the parallel transistors 85 and 86. The operation of the enable circuitry is the same in circuit 80 as in circuit 60 of FIG. 6. Whenever enable node 82 is high, output node 90 will be at the same level as the output from inverter 84. Thus, output 90 will be the inverted signal of the data node 81 whenever enable node 82 is high. Whenever enable node 82 is low, output node 90 will float. Thus, when enable equals 1, out equals inverted data, and when enable equals 0, output node 90 is floating.

Thus, a BiCMOS circuit is disclosed which can be used as protection against negative $V_{BE}$ or to tri-state a bipolar device. Illustrative uses of this circuit, including in place of a bare-base bipolar device, as a pre-charge device, as a two-state non-inverting buffer and as a tri-state inverting and non-inverting buffer have been shown.

We claim:

1. A BiCMOS circuit, comprising:
   a first input node;
   an output node;
   an inverter coupled to said first input node;
   a bipolar transistor having a base, a collector coupled to a power supply, and an emitter coupled to said output node;
   means for electrically coupling said base of said bipolar transistor to said output whenever a low potential is applied to said first input node, said means comprising a pair of CMOS transistors comprising a first and a second transistor, each of said first and second transistors having a gate, a source, and a drain, wherein the gates of said first and second transistors are coupled to an output of said inverter, said source of said first transistor is coupled to said first input node, said drain of said first transistor is coupled to said base of said bipolar transistor and to said drain of said second transistor, and said source of said second transistor and said emitter of said bipolar transistor are coupled to said output node; and
   a third transistor having a gate, a source, and a drain, wherein said gate of said third transistor is coupled to said output of said inverter, said drain of said third transistor is coupled to said output node, and said source of said third transistor is coupled to ground.

2. The circuit as described in claim 1, wherein said first transistor is a p-type MOS transistor, said second transistor is an n-type MOS transistor, and said third transistor is an n-type MOS transistor.

3. The circuit as described in claim 2, further comprising a fourth transistor coupled in parallel with the second transistor, wherein the fourth transistor is a p-type MOS transistor, wherein the fourth transistor has a gate coupled to the first input node.

4. A BiCMOS non-inverting tri-state buffer circuit, comprising:
   a) a bipolar transistor having a base, a collector coupled to a power supply, and an emitter coupled to an output of said circuit;
   b) a first transistor having a gate coupled to a first input via a first inverter, a drain coupled to said output node, and a source coupled to ground, wherein the drain of the first transistor is directly coupled to the output node, wherein the source of the first transistor is directly coupled to ground, wherein the first transistor is a MOS transistor, wherein the drain of the first transistor is not electrically coupled to the gate of the first transistor;
   c) a second transistor having a gate coupled to a second input via a second inverter, a drain coupled to said gate of said first transistor, and a source coupled to ground, wherein when said second input is in a first voltage state, said second transistor is turned off, wherein when said second input is in a second voltage state, said second transistor is turned on that causes said first transistor to be turned off which in turn causes the output node to float;

d) means including a third transistor having a drain coupled to said base of said bipolar transistor, a source coupled to said output node, and a gate coupled to said second input via said second inverter for coupling said base of said bipolar transistor to said output node when said second input is in the first voltage state;

e) a fourth transistor having a drain coupled to said base of said bipolar transistor, a source coupled to said first input, and a gate coupled to said gate of said third transistor, wherein when said second input is in said first voltage state, said third transistor couples said base of said bipolar transistor to said output node, wherein when said first input is in said first voltage state and said second input is in said second voltage state, said base of said bipolar transistor assumes a voltage equal to said first voltage state plus a threshold voltage of said fourth transistor at which said fourth transistor is turned off.

5. The circuit of claim 4, wherein said first, second, and third transistors are N-channel MOS transistors and said fourth transistor is a P-channel MOS transistor.

6. The circuit of claim 5, wherein said coupling means further comprises a fifth transistor coupled in parallel with said third transistor, wherein said fifth transistor has a gate coupled to said second input, wherein said fifth transistor is a P-channel MOS transistor.

7. The circuit of claim 4, wherein said first voltage state is a logical low voltage and said second voltage state is a logical high voltage.

8. The circuit of claim 4, wherein said first input is a data input and said second input is a control input.

9. A BiCMOS inverting tri-state buffer circuit, comprising:

a) a bipolar transistor having a base, a collector coupled to a power supply, and an emitter coupled to an output of the circuit;

b) a first transistor having a gate coupled to a first input, a drain coupled to said output node, and a source coupled to ground, wherein the drain of the first transistor is directly coupled to the output node, wherein the source of the first transistor is directly coupled to ground, wherein the first transistor is a MOS transistor, wherein the drain of the first transistor is not electrically coupled to the gate of the first transistor;

c) a second transistor having a gate coupled to a second input via a first inverter, a drain coupled to said gate of said first transistor, and a source coupled to ground, wherein when said second input is in a first voltage state, said second transistor is turned off, wherein when said second input is in a second voltage state, said second transistor is turned on that causes said first transistor to be turned off which in turn causes the output node to float;

d) means having a third transistor having a drain coupled to said base of said bipolar transistor, a source coupled to said output node, and a gate coupled to said second input via said first inverter for coupling said base of said bipolar transistor to said output node when said second input is in the first voltage state;

e) a fourth transistor having a drain coupled to said base of said bipolar transistor, a source coupled to said first input via a second inverter, and a gate coupled to said gate of said third transistor, wherein when said second input is in said first voltage state, said third transistor couples said base of said bipolar transistor to said output node, wherein when said first input is in the second voltage state and said second input is in said second voltage state, said base of said bipolar transistor assumes a voltage equal to said first voltage state plus a threshold voltage of said fourth transistor at which said fourth transistor is turned off.

10. The circuit of claim 9, wherein said first, second, and third transistor are N-channel MOS transistors and said fourth transistor is a P-channel MOS transistor.

11. The circuit of claim 9, wherein said first voltage state is a logical low voltage and said second voltage state is a logical high voltage.

12. The circuit of claim 9, wherein said first input is a data input and said second input is a control input.

13. The circuit of claim 10, wherein said coupling means further comprises a fifth transistor coupled in parallel with said third transistor, wherein said fifth transistor has a gate coupled to said second input, wherein said fifth transistor is a P-channel MOS transistor.

* * * * *

UNITED STATES PATENT AND TRADEMARK OFFICE
CERTIFICATE OF CORRECTION

PATENT NO. : 5,300,829
DATED : April 5, 1994
INVENTOR(S) : Lavi. A. Lev, Lan A. Young It is certified that error appears in the above-indentified patent and that said Letters Patent is hereby corrected as shown below:

Column 2, Line 61;    Insert --is described-- following "$V_{BE}$"
Column 2, Line 64;    Insert --art that the-- following "the"
Column 2, Line 65;    Insert --other instances,-- following "In"
Column 2, Line 68;    Insert --use of this circuit-- following "the"
Column 3, Line 1;     Insert --a pre-charge-- following "of" and before "circuit"
Column 3, Line 2;     Insert --will be-- following "it"
Column 3, Line 3;     Insert --invention can be used-- following "present"

Signed and Sealed this

Third Day of October, 1995

Attest:

BRUCE LEHMAN

*Attesting Officer*    *Commissioner of Patents and Trademarks*